United States Patent [19]

Aoyama et al.

[11] Patent Number: 4,573,147

[45] Date of Patent: Feb. 25, 1986

[54] SEMICONDUCTOR MEMORY DEVICE

[75] Inventors: Keizo Aoyama, Yamato; Takahiko Yamauchi; Teruo Seki, both of Kawasaki, all of Japan

[73] Assignee: Fujitsu Limited, Kawasaki, Japan

[21] Appl. No.: 478,722

[22] Filed: Mar. 25, 1983

[30] Foreign Application Priority Data

Mar. 30, 1982 [JP] Japan ................................ 57-50098

[51] Int. Cl.$^4$ ............................................. G11C 11/40
[52] U.S. Cl. ...................................... 365/230; 365/190
[58] Field of Search ................. 365/189, 190, 202, 230

[56] References Cited

U.S. PATENT DOCUMENTS 4,247,791 1/1981 Rovell ................................. 307/355

FOREIGN PATENT DOCUMENTS 0043245 1/1982 European Pat. Off. .

OTHER PUBLICATIONS

IBM Technical Disclosure Bulletin, "Latch for Data Store", L. A. Caprio et al., vol. 19, No. 5, Oct. 1976, pp. 1810–1811.

Primary Examiner—Joseph A. Popek
Attorney, Agent, or Firm—Staas & Halsey

[57] ABSTRACT

A semiconductor memory device such as a static-type random-access memory device includes an address-change detection circuit which generates a pulse signal when an input address signal has changed and a latch circuit which temporarily stores the readout signal from the selected memory cell. The readout signal is input into the latch circuit in synchronization with the timing of the pulse signal or a short time after the pulse signal, and the readout data from the semiconductor memory device is obtained from the latch circuit, thereby increasing the time interval during which the readout data from the semiconductor memory device is available.

12 Claims, 9 Drawing Figures

Fig. 7A  Fig. 7B
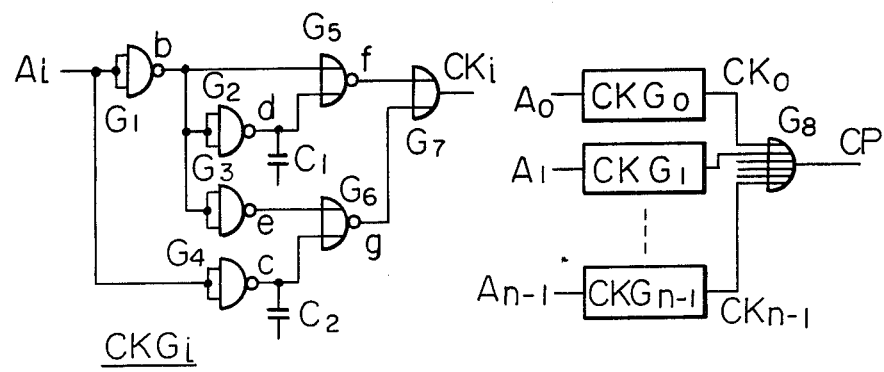
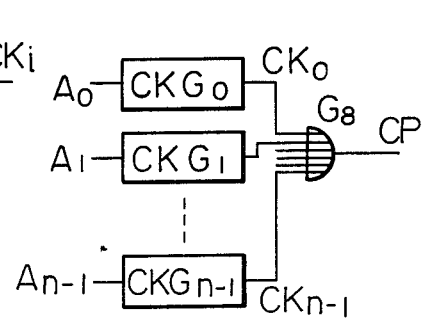
Fig. 8
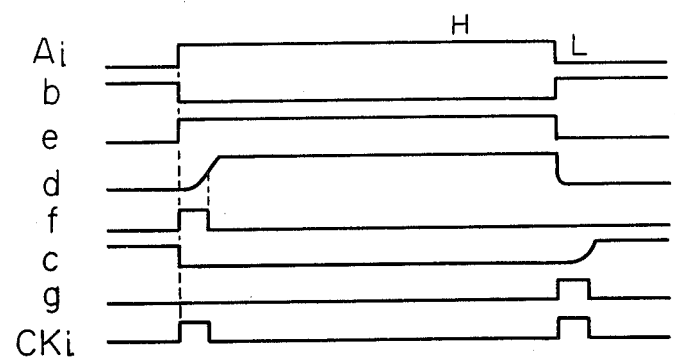

SEMICONDUCTOR MEMORY DEVICE

BACKGROUND OF THE INVENTION (1) Field of the Invention

The present invention relates to a static-type semiconductor memory device and more particularly to a semiconductor memory device in which the length of time during which readout data is obtainable is increased and the reading out of data is reliably effected.

(2) Description of the Prior Art

Generally, in a semiconductor memory device, readout data is obtained by gating the output data from a sense amplifier with a strobe pulse after a predetermined time has passed since the time when new input address signals were input, i.e., when input address signals were changed. Therefore, it is desirable that the length of time during which readout data can be obtained by using a strobe pulse, i.e., during which the reading out of data is possible, be as long as possible.

FIG. 1 is a schematic diagram of the structure of a conventional static-type semiconductor memory device. In FIG. 1, MC designates a memory cell connected to a word line WL and bit lines BL and $\overline{BL}$. $Q_1$ and $Q_2$ designate transistors, used as transfer gates, connected between the bit lines BL and $\overline{BL}$ and data buses DB and $\overline{DB}$, respectively. RB is a row address buffer, RD is a row address decoder connected to the word line WL, CB is a column address buffer, CD is a column address decoder for driving the transistors $Q_1$ and $Q_2$, SA is a sense amplifier connected to the data buses DB and $\overline{DB}$, and OB is an output buffer.

In the structure of FIG. 1, when information is read out of the memory cell MC, row address input signals $RA_{IN}$ and column address input signals $CA_{IN}$ are input into the row address buffer RB and the column address buffer CB, respectively, and, thereby, both the output signal of the row address decoder RD and the output signal of the column address decoder CD are rendered high. Thus, the potential of the word line WL becomes high and the memory cell MC is connected to the bit lines BL and $\overline{BL}$. At this time, the transistors $Q_1$ and $Q_2$ are turned on and the bit lines BL and $\overline{BL}$ are connected to the data buses DB and $\overline{DB}$, respectively. Therefore, the data signal from the memory cell MC is detected by the sense amplifier SA and is output as a data output signal $D_{OUT}$ after it is amplified by the output buffer OB.

Since a plurality of memory cells are connected to the word line WL, the time interval between the time when the address input signals are changed and the time when the output signal of the row address decoder, i.e., the potential of the word line WL, becomes high, is relatively long, as is illustrated in FIG. 2. The output of the column address decoder CD also rises a short time after the address input signals are changed. Therefore, the time interval between the time when the address input signals are changed and the time when the readout data $D_{OUT}$ is first available, varies from a time $td_1$ to a time $td_2$, as shown in FIG. 2. In this case, the time $td_1$ is the time period between the time when the address input signals are changed and the time when the output of the column address decoder CD rises and the transistors $Q_1$ and $Q_2$ are turned on. The time $td_1$ corresponds to the data readout time in a case where the column addresses are changed but the row addresses are not changed. The time $td_2$ corresponds to the data readout time in a case where both the column addresses and the row addresses are changed. Therefore, in the semiconductor memory device of FIG. 1, the time interval between the time when the address input signals are changed and the time when the readout data is first available, i.e., the data readout time varies from the time $td_1$ to the time $td_2$, and the time interval $t_{HOLD}$ during which the readout data is made available by gating it with a strobe pulse, become relatively short, as is illustrated in FIG. 2.

SUMMARY OF THE INVENTION

In order to eliminate the above-mentioned problems of a conventional memory device, in the static-type semiconductor memory device of the present invention a latch circuit is provided in the next stage of a sense amplifier, and the readout data is input from the sense amplifier into the latch circuit when the address input signals are changed or when a predetermined time period has elapsed after the address input signals have been changed.

It is an object of the present invention to increase the length of the time interval during which readout data is available from a semiconductor memory device and to reliably effect the reading out of data.

According to the present invention, this object is attained by providing a semiconductor memory device which comprises an address-change detector circuit which generates a pulse signal when an input address signal has changed and a latch circuit which temporarily stores the readout signal from a memory cell. The readout signal is input into said latch circuit in response to the pulse signal or the delayed signal of the pulse signal and readout data is obtained from the output terminal of the latch circuit.

BRIEF DESCRIPTION OF THE DRAWINGS

FIGS. 7A and 7B are block circuit diagrams of the structure of an address-change detection circuit used in the semiconductor memory device of FIG. 3; and FIG. 8 is a waveform diagram of the operation of the circuit of FIGS. 7A and 7B.

DESCRIPTION OF THE PREFERRED EMBODIMENT

Figure 3:
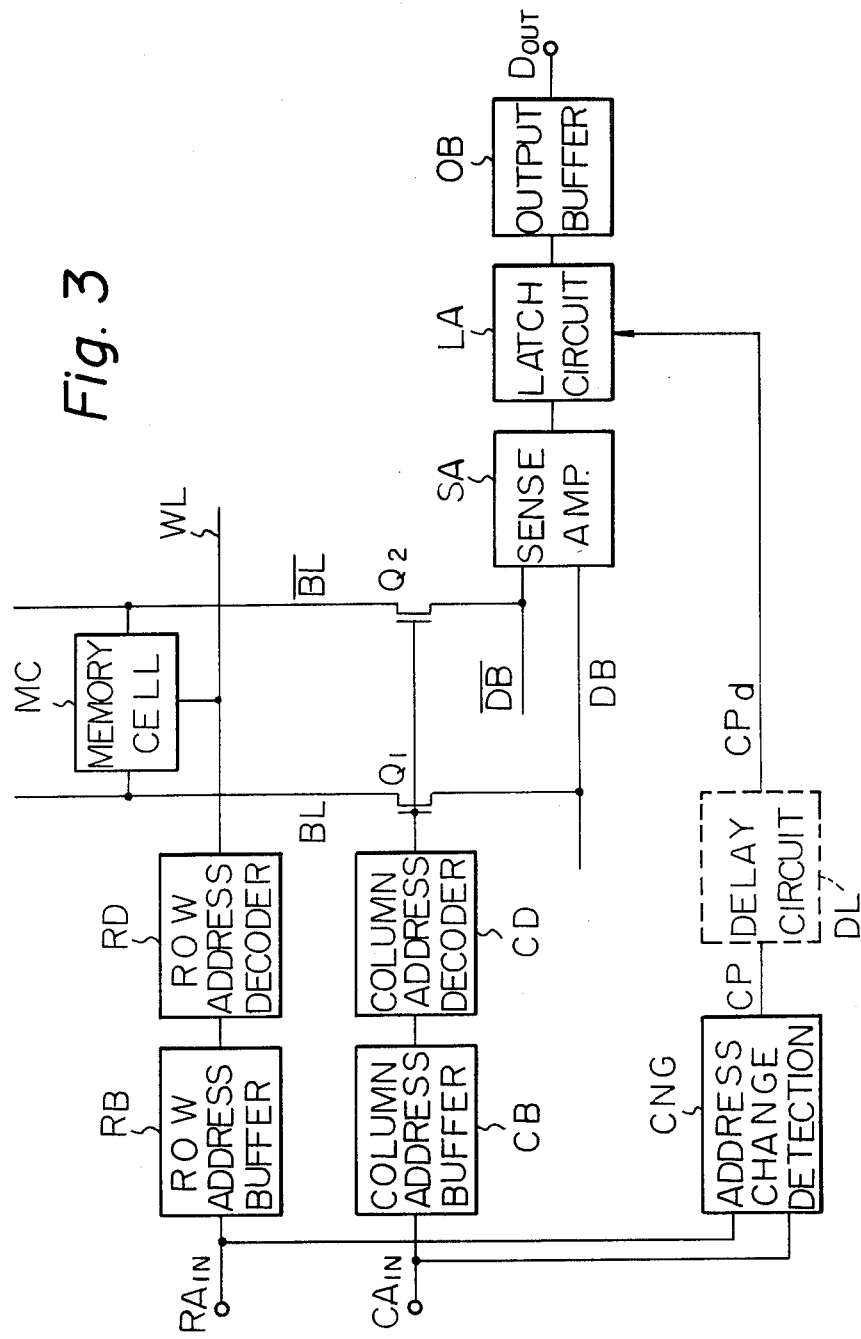
FIG. 3 is a partial block circuit diagram of a semiconductor memory device according to an embodiment of the present invention.

The embodiment of the present invention is explained with reference to the attached drawings. FIG. 3 is a semiconductor memory device which is an embodiment of the present invention. The memory device of FIG. 3 has the same structure as that of the semiconductor memory device of FIG. 1 except that the memory device of FIG. 3 further comprises an address-change detection circuit CNG, a delay circuit DL, and a latch circuit LA inserted between a sense amplifier SA and an output buffer OB.

Figure 1:
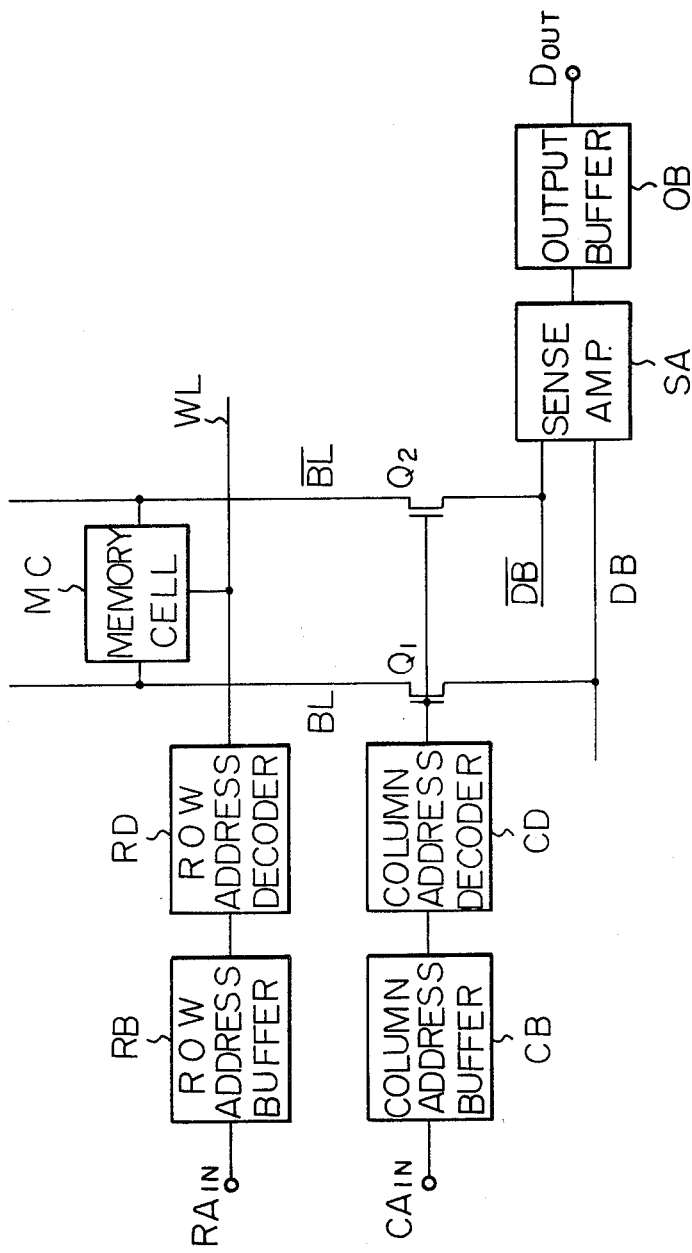
FIG. 1 is a partial block circuit diagram of a conventional semiconductor memory device.
Figure 2:
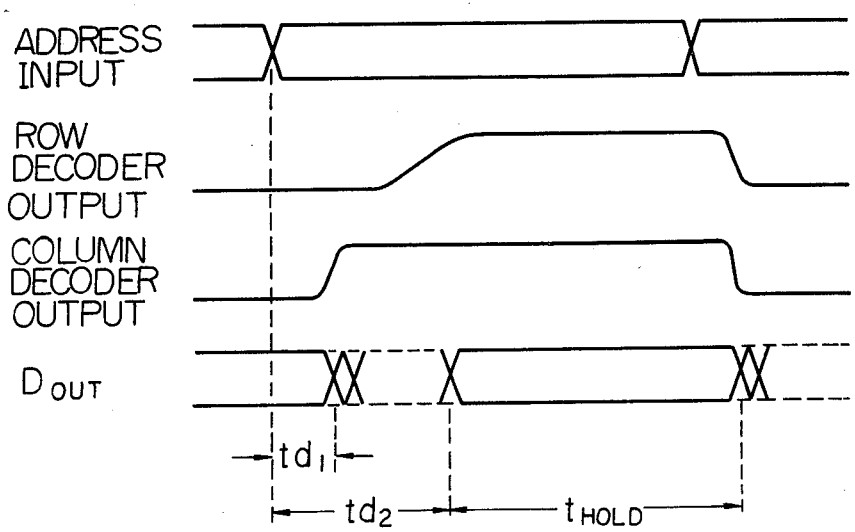
FIG. 2 is a waveform diagram of the operation of the semiconductor memory device of FIG. 1.
Figure 4:
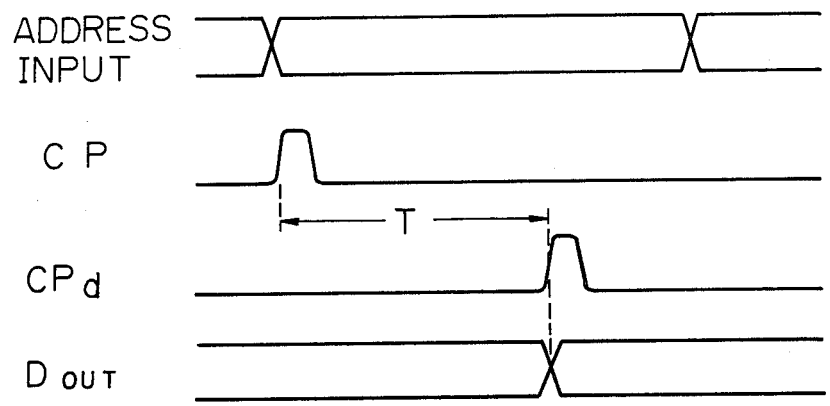
FIG. 4 is a waveform diagram of the operation of the semiconductor memory device of FIG. 3.

In the semiconductor memory device of FIG. 3, when the row address input signals $RA_{IN}$ and the column address input signals $CA_{IN}$ are supplied thereto in a manner similar to that in the semiconductor memory device of FIG. 1, the data from the memory cell MC is detected and amplified by the sense amplifier SA through the bit lines BL and $\overline{BL}$, the transistors $Q_1$ and $Q_2$, and the data buses DB and $\overline{DB}$. The address-change detection circuit CNG detects the change in each of the row address input signals $RA_{IN}$ and the column address input signals $CA_{IN}$ and generates a detection clock pulse CP. The detection clock pulse CP is delayed for a predetermined time T, and a clock pulse $CP_d$, shown in FIG. 4, is generated. The clock pulse $CP_d$ is transmitted to the latch circuit LA which reads in the data of the memory cell MC from the sense amplifier SA in synchronization with the timing of the clock pulse $CP_d$. The output signal of the latch circuit LA is output through the output buffer OB as readout data $D_{OUT}$ of the memory device. In this case, the delay time T of the delay circuit DL is selected so that the clock pulse $CP_d$ exists within a time interval $t_{HOLD}$, during which the readout data is available. If the delay time T of the delay circuit DL is within a particular range, for example, if the delay time T is very small, the delay circuit DL may be omitted. In such a memory device, the data signal read out from the memory cell MC is input into the latch circuit LA, for example, in synchronization with the timing of the rising edge of the clock pulse $CP_d$ and is held for a time interval approximately corresponding to one time period of the clock pulse $CP_d$ by the latch circuit LA. Therefore, the length of time during which the readout data $D_{OUT}$ is available is approximately equal to the length of time of one period of the clock pulse $CP_d$, i.e., the length of one cycle time of the memory device.

Figure 5:
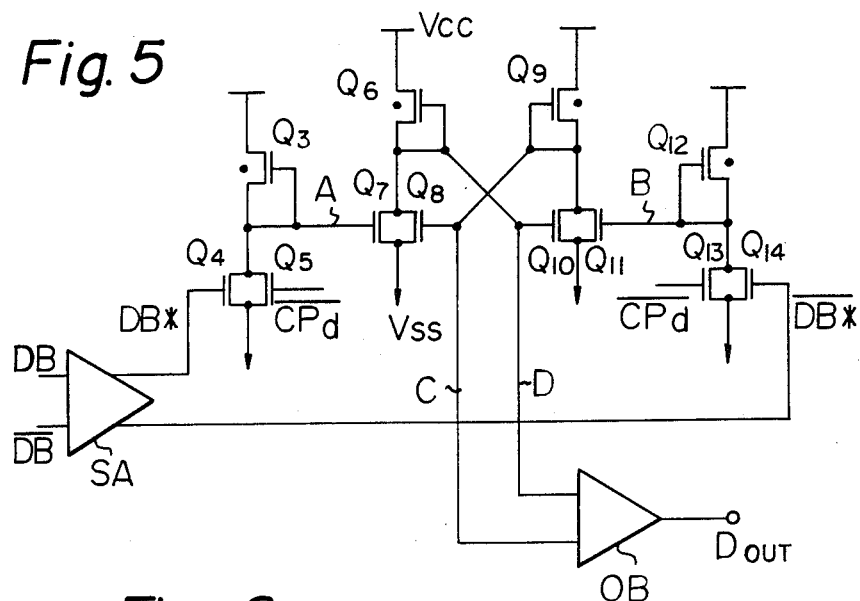
FIG. 5 is a block circuit diagram of the structure of a latch circuit used in the semiconductor memory device of FIG. 3.

FIG. 5 is a detailed circuit diagram of the structure of a latch circuit used in the semiconductor memory device of FIG. 3. The latch circuit of FIG. 5 comprises N-channel metal-oxide semiconductor transistors $Q_3$ through $Q_{14}$. The transistors $Q_3$, $Q_6$, $Q_9$, and $Q_{12}$ are depletion-type transistors which comprise load transistors whose gates and sources are connected to each other. The transistors $Q_3$, $Q_4$, and $Q_5$ and the transistors $Q_{12}$, $Q_{13}$, and $Q_{14}$ form NOR gates, respectively.

Figure 6:
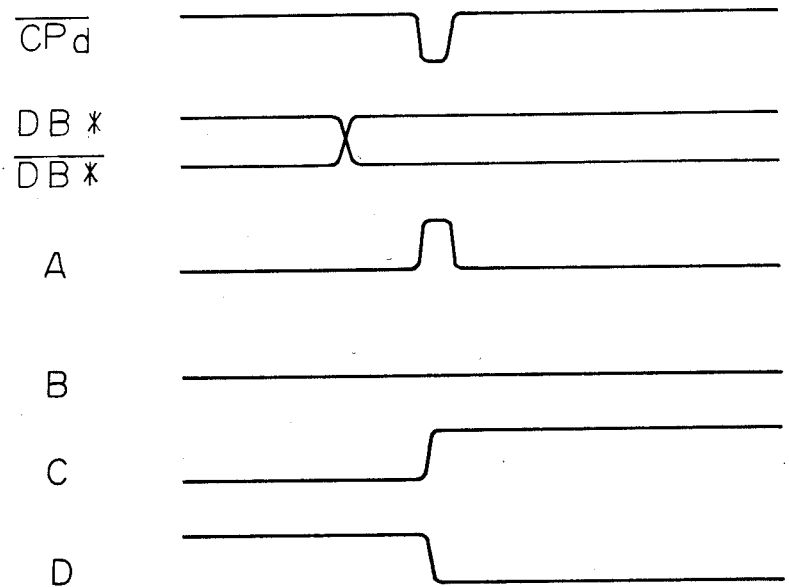
FIG. 6 is a waveform diagram of signals on each node of the latch circuit of FIG. 5.

As is shown in FIG. 6, when an inverted clock signal $\overline{CP}_d$ applied to the circuit of FIG. 5 is high, the transistors $Q_5$ and $Q_{13}$ are in a turned on condition and the potentials of a node A and a node B are low. When the inverted clock pulse $\overline{CP}_d$ becomes low, the transistors $Q_5$ and $Q_{13}$ are turned off. In this condition, if output signals DB* and $\overline{DB}$* of the sense amplifier SA are low and high, respectively, the transistors $Q_4$ is turned off and the transistor $Q_{14}$ is turned on. Therefore, the potential of the node A becomes high and the potential of the node B is maintained in a low level condition. Thus, the transistor $Q_7$ is turned on and the potential of a node D becomes low. Since the transistors $Q_{10}$ and $Q_{11}$ are both in a turned off condition, the potential of a node C becomes high and the transistor $Q_8$ is turned on. Therefore, even after the inverted clock signal $\overline{CP}_d$ again becomes high, the transistors $Q_8$ and $Q_{10}$ are kept in a turned on condition and in a turned off condition, respectively, and the output signals DB* and $\overline{DB}$* of the sense amplifier are latched by the latch circuit LA at the leading edge of the inverted clock signal $\overline{CP}_d$. The signals on the node C and D are supplied to the output buffer OB, which outputs the readout data $D_{OUT}$ corresponding to the signals on the nodes C and D.

FIGS. 7A and 7B are examples of an address-change detection circuit for generating the above-mentioned clock pulse CP. In FIG. 7A, $G_1$ through $G_4$ are NAND gates, $G_5$ and $G_6$ are NOR gates, and $G_7$ is an OR gate. These gates are connected in the manner illustrated in FIG. 7A. $C_1$ and $C_2$ are capacitors connected between the output of the NAND gate $G_2$ and ground and between the output of the NAND gate $G_4$ and ground. The circuit of FIG. 7A receives a one bit address signal $A_i$ from address signals $A_0$ through $A_{n-1}$, including row address input signals $RA_{IN}$ and column address input signals $CA_{IN}$, and outputs a clock signal $CK_i$. In FIG. 7B, the circuit $CKG_i$ of FIG. 7A receives each bit of the address signals. The output signals from the circuits $CKG_0$, $CKG_1$, ---, $CKG_{n-1}$ are coupled with an OR gate $G_8$ so as to generate the clock pulse CP.

The operation of the above-mentioned address-change detecting circuit is explained with reference to FIG. 8. In the circuit of FIG. 7A, when the address signal $A_i$ changes from a low level (L) to a high level (H), as is shown in FIG. 8, the output b of the NAND gate $G_1$ changes from a high level to a low level. In this case, the output d of the NAND gate $G_2$ becomes an inverted signal which is slightly delayed by the capacitor $C_1$, and, therefore, the output f of the NOR gate $G_5$ becomes a pulse signal which has a small width and which is generated at the rising edge of the address signal $A_i$. When the address signal $A_i$ changes from a high level to a low level, the output e of the NAND gate $G_3$ changes from a high level to a low level in a manner similar to that of the address signal $A_i$. At this time, the output c of the NAND gate $G_4$ becomes an inverted signal c which is slightly delayed by the capacitor $C_2$, and thus the NOR gate $G_6$ outputs a pulse signal which is generated at the falling edge of the address signal $A_i$. The clock signal $CK_i$, which is generated by coupling the outputs of the NOR gates $G_5$ and $G_6$ by using the OR gate $G_{7d}$, becomes a pulse signal which has a small width and which is generated at every transient time of the adress signal $A_i$. In FIG. 7B, clock signals $CK_0$ through $CK_{n-1}$, each of which is generated by a circuit similar to that of FIG. 7A, are coupled by the OR gate $G_8$, and the clock pulse CP is obtained, the clock pulse CP being generated when at least one of the bits of the address input signal has changed.

As was mentioned above, according to the present invention, the readout data from a memory cell is input into the latch circuit when an address input signal is changed or a short time after the address input signal is changed, and the readout data is output from the latch circuit. Therefore, the time interval during which the readout data is available does not vary in accordance with the contents of the address input, and it is possible to obtain readout data during approximately the whole cycle time in each cycle time of the semiconductor memory device. Consequently, according to the present invention, it is possible to increase the length of time during which readout data is available and to reliably effect the readout operation.

We claim:

1. A semiconductor memory device, operatively connectable to receive input address signals having a plurality of bits, including a memory cell for storing and generating readout signals, said semiconductor memory device comprising:

an address-change detection circuit, operatively connected to receive the input address signals, for generating a pulse signal when one of the input address signals changes; and a latch circuit, operatively connected to the memory cell and said address change circuit, for temporarily storing the readout signals from the memory cell in response to said pulse signal.

2. A semiconductor memory device according to claim 1, further comprising:

a sense amplifier, operatively connected to the memory cell and said latch circuit, for amplifying the readout signals from the memory cell and outputting amplified signals, wherein said latch circuit receives the amplified signals from said sense amplifier and outputs output signals; and an output buffer, operatively connected to said latch circuit, for receiving the output signal from said latch circuit and outputting the output signals as readout signals to the semiconductor memory device.

3. a semiconductor memory device according to claim 2, further comprising a delay circuit, operatively connected to said address change circuit and said latch circuit, for delaying the pulse signal generated by said address change detection circuit and outputting a delayed pulse, wherein the amplified signals of said sense amplifier are stored in said latch circuit in response to the delayed pulse from said delay circuit.

4. A semiconductor memory device according to claim 2, wherein said latch circuit comprises:

two NOR gates, operatively connected to said sense amplifier, for receiving and outputting the amplified signals; and a flip-flop circuit, operatively connected between said two NOR gates, being set or reset by the amplified signals of said two NOR gates.

5. A semiconductor memory device according to claim 4, wherein each of said two NOR gates receives one of said pulse signal from said address-change detection circuit and said delayed signal and each of said two NOR gates receives the amplified signals from said sense amplifier.

6. A semiconductor memory device according to claim 4, wherein each of said two NOR gates comprises:

two inverter transistors connected in parallel and operatively connected to said sense amplifier; and a common load transistor operatively connected to said parallel connection of said two inverter transistors.

7. A semiconductor memory device according to claim 4, further comprising a power source operatively connectable to said flip-flop circuit, wherein said flip-flop circuit comprises:

a pair of cross-coupled transistors, each having a drain and each operatively connected to said output buffer;

a pair of input transistors, each of which is connected in parallel to one of said pair of crosscoupled transistors and each having a gate electrode for receiving the amplified signals from one of said NOR gates; and a pair of load transistors, each operatively connected between the drain of one of said crosscoupled transistors and the power source.

8. A semiconductor memory device according to claim 1, wherein said address-change detection circuit generates said pulse signal when at least one bit of the input address signals changes.

9. A semiconductor memory device according to claim 8, wherein the input address signals include column address signals and row address signals.

10. A semiconductor memory device operatively connected to receive input address signals, including a memory cell for storing and generating readout signals, comprising:

a sense amplifier, operatively connected to the memory cell, for amplifying the readout signals from the memory cell and outputting amplified signals;

a latch circuit, operatively connected to said sense amplifier, for receiving the amplified signals and outputting latched signals;

an address change detection circuit, operatively connected to receive the input address signals and operatively connected to said latch circuit, for generating a pulse signal when one of the input address signals changes, said latch circuit receiving the amplified signals in response to the pulse signal; and an output buffer, operatively connected to said latch circuit, for receiving and outputting the latched signals.

11. A semiconductor memory device according to claim 10, further comprising a delay circuit, operatively connected to said address change detection circuit and said latch circuit, for delaying the pulse signal and outputting a delayed pulse to said latch circuit.

12. A semiconductor device opertively connected to receive input address signals, including a memory cell for storing and generating readout signals, comprising:

amplifier means, operatively connected to the memory cell, for amplifying the readout signals from the memory cell and outputting amplified signals;

latch means, operatively connected to said amplifier means, for receiving the amplified signals and outputting latched signals;

detection means, operatively connected to receive the input address signals and operatively connected to said latch means, for generating a pulse signal when one of the input address signals changes, said latch means receiving the amplified signals in response to the pulse signals; and buffer means, operatively connected to said latch means, for receiving and outputting the latched signals.

* * * * *

UNITED STATES PATENT AND TRADEMARK OFFICE
CERTIFICATE OF CORRECTION

PATENT NO. : 4,573,147
DATED : FEBRUARY 25, 1986
INVENTOR(S) : KEIZO AOYAMA ET AL.

It is certified that error appears in the above-identified patent and that said Letters Patent is hereby corrected as shown below:

FRONT PAGE [57] ABSTRACT, line 6, "the" should be --a--.

Col. 4, line 40, "$G_{7d}$," should be --$G_7$,--;

line 42, "adress" should be --address--.

Col. 5, line 22, "a" should be --A--.

Col. 6, line 2, "crosscoupled" should be --cross-coupled--;
　　　　line 7, "crosscoupled" should be --cross-coupled--;
　　　　line 41, "opertively" should be --operatively--.

Signed and Sealed this

Twenty-seventh Day of May 1986

[SEAL]

Attest:

DONALD J. QUIGG

Attesting Officer

Commissioner of Patents and Trademarks